United States Patent [19]

Mekata et al.

[11] Patent Number: 4,707,669

[45] Date of Patent: Nov. 17, 1987

[54] DIELECTRIC RESONATOR MICROWAVE OSCILLATOR HAVING ENHANCED NEGATIVE RESISTANCE

[75] Inventors: Tsuyoshi Mekata, Hirakata; Hiroshi Saka, Katano; Toshihide Tanaka, Ikoma, all of Japan

[73] Assignee: Matsushita Electric Industrial Co., Ltd., Kadoma, Japan

[21] Appl. No.: 864,862

[22] Filed: May 20, 1986

[30] Foreign Application Priority Data

| May 21, 1985 | [JP] | Japan | 60-108830 |
| Jul. 30, 1985 | [JP] | Japan | 60-167917 |
| Dec. 6, 1985 | [JP] | Japan | 60-275301 |
| Apr. 15, 1986 | [JP] | Japan | 61-86476 |

[51] Int. Cl.$^4$ .......................................... H03B 5/18
[52] U.S. Cl. ................................. 331/99; 331/117 D; 331/117 FE
[58] Field of Search .............. 331/117 D, 117 FE, 96, 331/99, 107 SL

[56] References Cited

U.S. PATENT DOCUMENTS 4,435,688  3/1984  Shinkawa et al. ..................... 331/99

OTHER PUBLICATIONS

Mori et al., IEEE International Microwave Symposium Digest, Washington, D.C. May 28–30, 1980, pp. 376–378.
Ishihara et al., IEEE Transactions on Microwave Theory and Techniques, vol. MTT-28, No. 8, Aug. 1980, pp. 817–824.
Tsironis et al., "Stable Monolithic GaAs FET Oscillator," Electronics Letters, vol. 18, No. 8, Apr. 15, 1982, pp. 345–347.

Primary Examiner—Siegfried H. Grimm
Attorney, Agent, or Firm—Cushman, Darby & Cushman

[57] ABSTRACT

A dielectric resonator microwave oscillator in which the gate of a FET is connected to a resonance circuit. An inductor is connected to the drain of the FET, and the output is taken from the source of the FET. This dielectric resonator microwave oscillator has enhanced negative resistance and positively starts the oscillation even when there is a low reflection coefficient of the resonance circuit. Using a circuit which consists of a capacitor and inductor between the source and the output terminal, a further increasing of negative resistance at the gate of the FET is obtained.

12 Claims, 20 Drawing Figures

DIELECTRIC RESONATOR MICROWAVE OSCILLATOR HAVING ENHANCED NEGATIVE RESISTANCE

BACKGROUND OF THE INVENTION

1. Field of the Invention

The present invention relates generally to a microwave oscillator and particularly to an improved microwave oscillator capable of stable oscillation even when a FET is used therein which is other than a package FET.

2. Description of the Prior Art

A conventional microwave oscillator has been disclosed, for instance, in Japanese Published Unexamined Patent Application No. Sho 57-26902.

FIG. 1 is a circuit diagram of the conventional microwave oscillator of the above-mentioned application, wherein an FET 1a is connected by its gate 11a to one end of a strip line 4a, the other end thereof being terminated by a dummy resistor 6a. The source 13a of FET 1a is connected to an output terminal 10a and also through a low pass filter 7a and a self bias resistor 8a to the ground. Drain 12a is connected to a power source terminal 3a and also to one end of openended transmission line 19a having a length of a quarter wavelength $\lambda_g/4$. A dielectric resonator 5a is coupled to the strip line 4a.

In the conventional microwave oscillator of the above-mentioned configuration, the ¼ wavelength open ended transmission line 19a grounds the drain 12a in microwave frequency. When a DC power source is supplied from the power terminal 3a, the potential of the gate 11a becomes lower than the potential of the source 13a, as a result of voltage drop caused by a current flowing through the self bias resistor 8a. According to the above-mentioned circuit configuration, oscillation is produced by cooperation of a negative resistance produced at the gate 11a and a resonance circuit consisting of the strip line 4a, and the dielectric resonator 5a coupled to the strip line 4a. The output of the oscillation signal is issued through the output terminal 10a.

In the above-mentioned prior art circuit configuration, however, when the FET 1a is configurated in a shape of a chip, or when the whole circuit is configurated in a monolithic integrated circuit, there arises a problem such that the negative resistance to be presented at the gate 11a is decreased, due to a decrease or elimination of the stray capacity which has existed in case of the prior art package 1. Therefore, the stability of the oscillation is lowered.

OBJECT AND SUMMARY OF THE INVENTION

The present invention intends to provide an improved microwave oscillator which can stably oscillate even when any FET 1 other than usually used package FET 1 is used.

The microwave oscillator in accordance with the present invention comprises:

an FET, a microwave resonator connected to the gate of the FET, an inductive element connected by one end to the drain of the FET, and grounded by the other end thereof with respect to the microwave frequency, and an output terminal connected to the source of the FET.

DESCRIPTION OF THE PREFERRED EMBODIMENT

The preferred embodiments in accordance with the present invention are disclosed hereinafter with reference to FIG. 2 and subsequent drawings.

Figure 1:
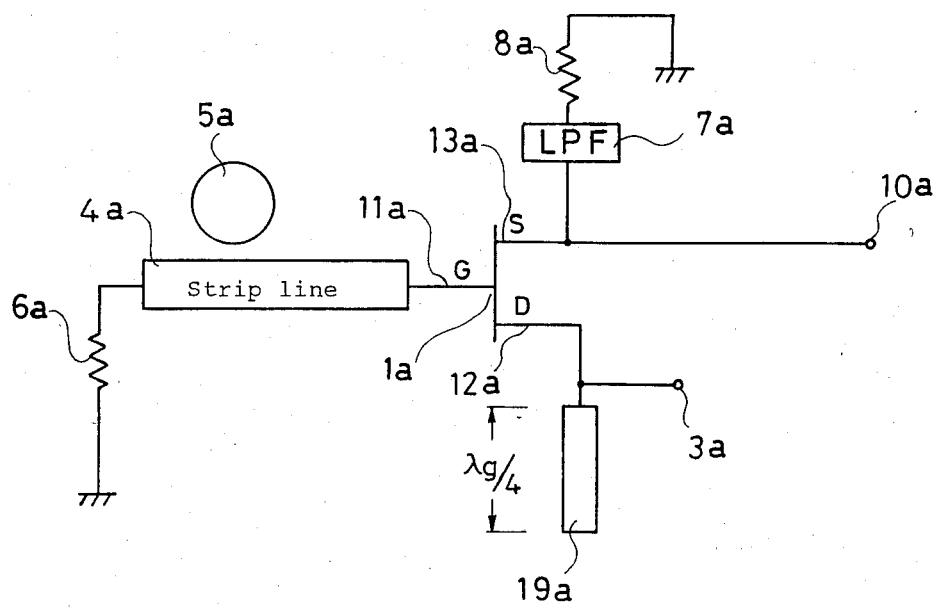
FIG. 1 is the circuit diagram of the prior art microwave oscillator.
Figure 2:
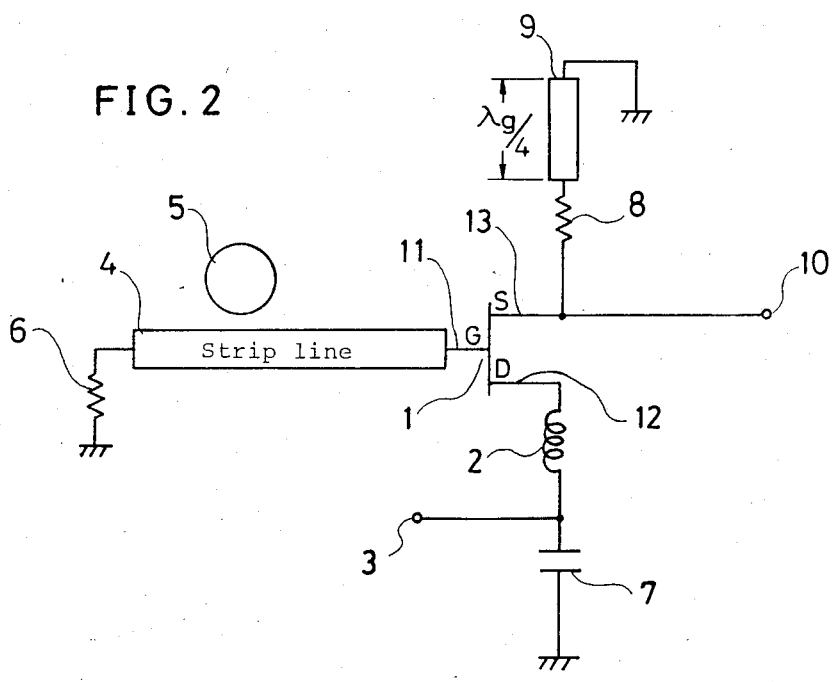
FIG. 2 is a circuit diagram of a microwave oscillator of a first embodiment.

FIG. 2 is a circuit diagram of a first embodiment of a microwave oscillator in accordance with the present invention, wherein a chip FET 1 is connected by its gate 11 to one end of a strip line 4, the other end thereof being terminated by a dummy resistor 6. FET 1 is connected by its source 13 to an output terminal 10, and also through a self bias resistor 8 and a ¼ wavelength transmission line 9 to ground. Drain 12 of FET 1 is connected through an inductive element 2 to a power source terminal 3, which is grounded through a bypass capacitor 7.

The operation of the microwave oscillator shown in FIG. 2 is elucidated. The non-grounded end of the ¼ wavelength transmission line 9 forms an open end in microwave frequency, hence this functions as a kind of low pass filter which passes only bias current, and the oscillation output is transmitted only to the output terminal 10. The dielectric resonator 5, which has a high Q value and the strip line 4 constitute a known resonance circuit, which oscillates at a resonance frequency of the dielectric resonator 5. The inductive element 2 has a function to increase negative resistance which occurs at the oscillation frequency at the gate 11 when the drain 12 of the chip FET 1 is grounded.

Figure 3:
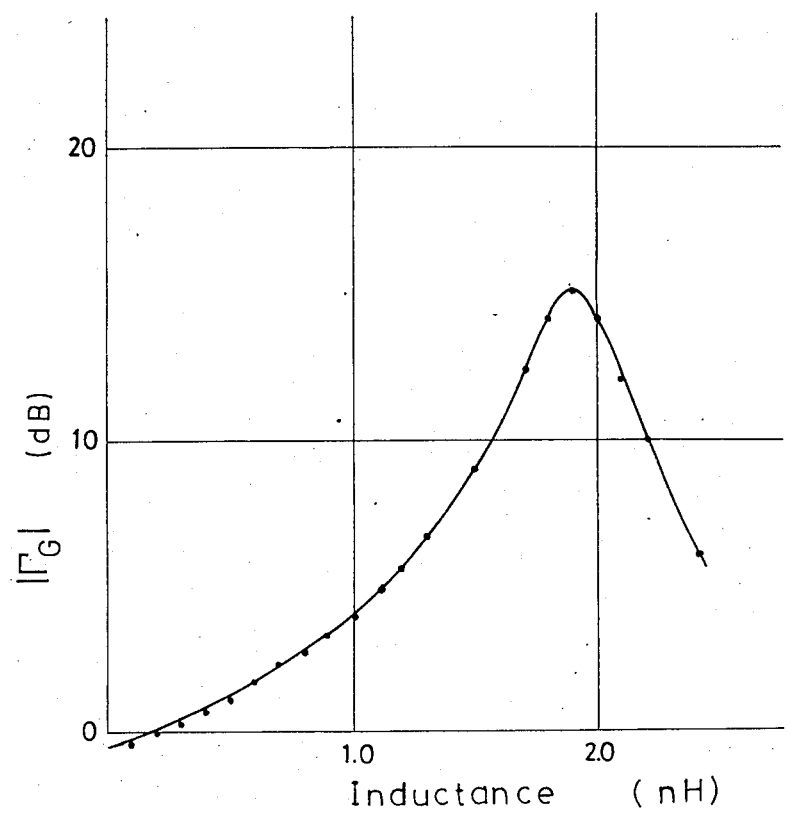
FIG. 3 is a graph showing a characteristic curve of the first embodiment.

The graph FIG. 3 shows a relation between the reflection coefficient $|\bar{G}|$ at the oscillation frequency of FET 1 seen from its gate 11. This graph shows negative resistance at the oscillation frequency induced at the gate 11 vs. the value of the inductance of the inductive element 2 for a chip FET 1, obtained by computation. As shown in FIG. 3, grounding the drain 12 through the inductive element 2 of 1.9 nH enables obtaining a higher negative resistance at the gate 11 as compared with direct grounding at microwave frequency. Grounding through the 1.9 nH inductive element 2, it becomes easy to make $|G|$ maximum. Therefore, oscillation starts stably even if the reflection coefficient of the resonant circuit consisting of the strip line 4 and the dielectric resonator 5 is low. As mentioned above, according to this embodiment, by grounding the drain 12 of the chip FET 1 through the inductive element 2, a stable microwave oscillator is obtainable.

Figure 4:
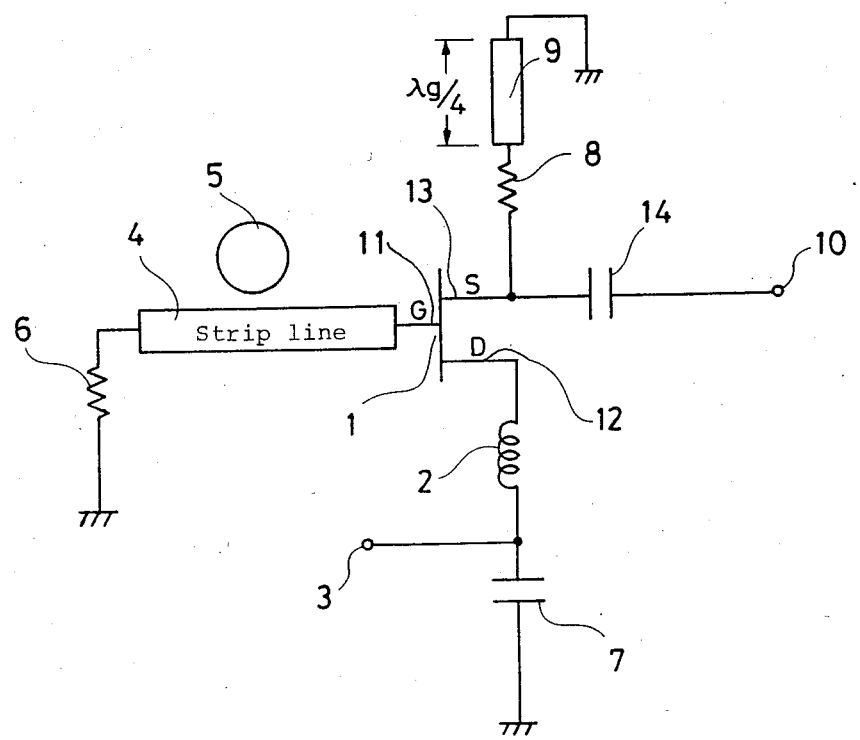
FIG. 4 is a circuit diagram of a microwave oscillator of a second embodiment.

FIG. 4 is a circuit diagram of a microwave oscillator of a second embodiment of the present invention. In this embodiment, a capacitor 14 is inserted between the source 13 and the output terminal 10, and other parts and components are configured the same as the first embodiment. The operation of the microwave oscillator shown in FIG. 4 is elucidated. Like the embodiment of FIG. 2, the non-grounded end of the ¼ wavelength transmission line 9 forms an open end at microwave frequency, which functions as a kind of low pass filter which passes only bias current. An oscillation output is transmitted only to the output terminal 10. The dielectric resonator 5 which has a high Q value, and the strip line 4 constitute a known resonance circuit, which oscillates at a resonance frequency of the dielectric resonator 5. The inductive element 2 has a function to increase the negative resistance which occurs at the oscillation frequency at the gate 11 when the drain 12 of the chip FET 1 is grounded. The operation of the parts other than the capacitor 14 is similar to the embodiment of FIG. 2. The capacitor 14 functions to increase the negative resistance at the gate 11 of the FET 1 at the oscillation frequency.

Figure 5:
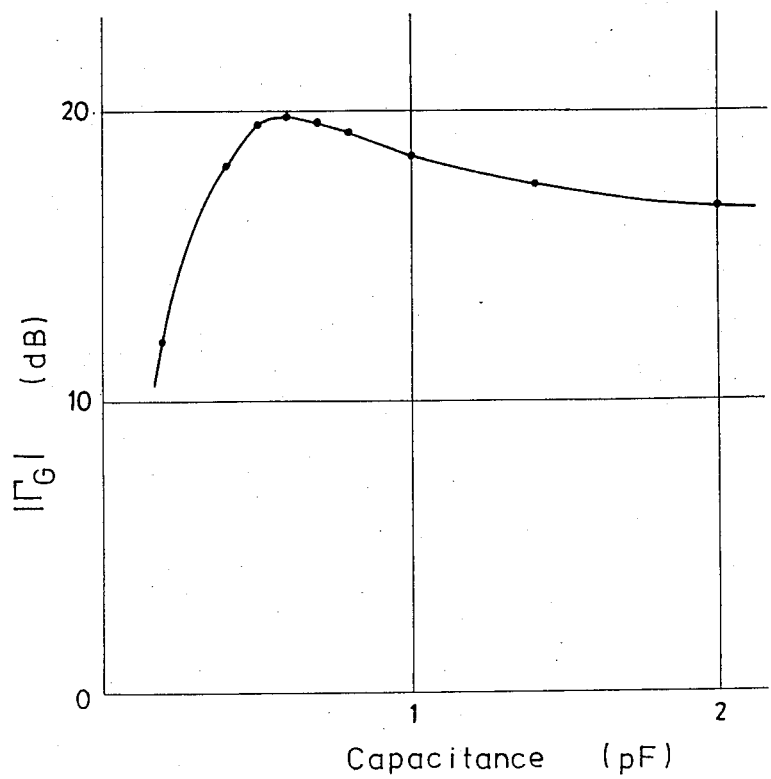
FIG. 5 is a graph showing a characteristic of the second embodiment.

The graph of FIG. 5 shows a relation between a reflection coefficient $|\bar{G}|$ at the oscillation frequency of FET 1 seen from its gate 11 which shows a negative resistance at the oscillation frequency (for instance, 10.75 GHz) induced at the gate 11 vs. the value of capacitance of the capacitor 14 for a chip FET 1, obtained by computation. As shown in FIG. 5, when the capacitance of the capacitor 14 is 0.6 PF, the negative resistance of the gate becomes maximum, and the value of the negative resistance becomes higher than that of FIG. 2 where there is no capacitor 14. That is, by providing the capacitor 14, a more stable microwave oscillator can be constituted. Furthermore, since the output terminal 10 and the source 13 are isolated by the capacitor 14 with respect to direct current, there is no need to insert a DC blocking capacitor at the output terminal. Therefore, the number of total electronic components can be decreased.

Figure 6:
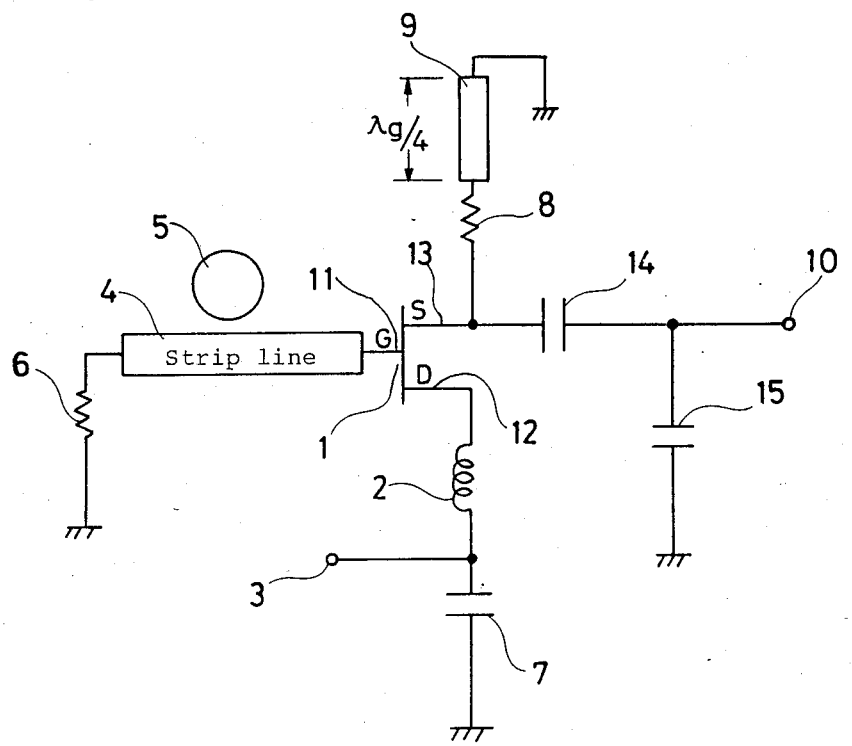
FIG. 6 is a circuit diagram of a microwave oscillator of a third embodiment.

FIG. 6 is a circuit diagram of a third embodiment of a microwave oscillator in accordance with the present invention, which has similar circuit configuration as the circuit of FIG. 4, except that a second capacitor 15 is connected between the output terminal 10 and the ground.

The operation of the microwave oscillator shown in FIG. 6 is similar to the foregoing embodiment of FIG. 4, except that the capacitor 15 functions to increase the reflection coefficient $|\bar{G}|$ at the oscillation frequency of FET 1 seen from its gate 11.

Figure 7:
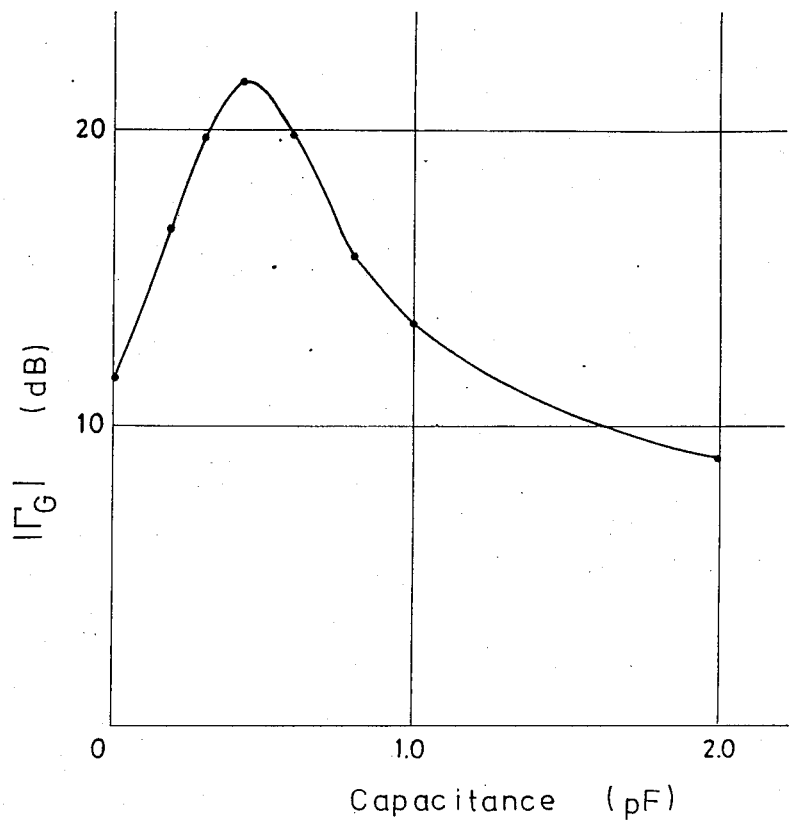
FIG. 7 is a graph showing a characteristic of the third embodiment.

The graph of FIG. 7 shows a relation between the reflection coefficient $|\bar{G}|$ at the oscillation frequency of FET 1 seen from its gate 11, which shows negative resistance at the oscillation frequency induced at the gate 11 vs. the value of capacitance of the capacitor 15, with respect to a use of a chip FET 1 wherein the inductance of the inductive element 2 is 1.5 nH, and the capacitance of the capacitor 14 is 0.7 PF and the oscillation frequency is 10.75 GHz. As shown in FIG. 7, when the capacitance of the capacitor 15 is 0.4 PF, the negative resistance becomes maximum, and the reflection coefficient $|\bar{G}|$ becomes larger than the maximum value of the embodiment of FIG. 4 wherein no capacitor 15 is provided. Furthermore, in the embodiment of FIG. 6, as a result of providing the capacitors 14 and 15, the load impedance of the microwave oscillator can be varied over a wide range.

Figure 8:
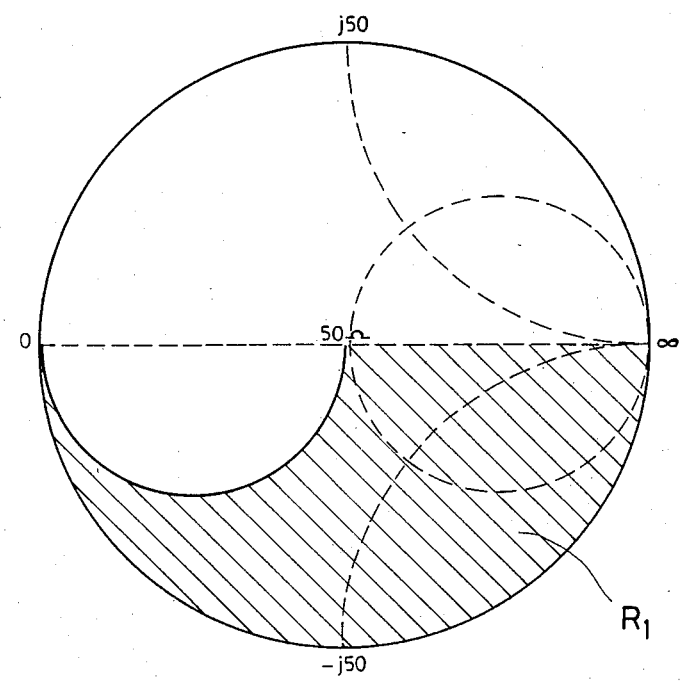
FIG. 8 is a a diagram showing a characteristic of the third embodiment.

FIG. 8 is a smith chart showing the load impedance seen from the load side of the source 13 of the embodiment of FIG. 6. And the chart shows, the impedance seen from the source terminal 13 can adopt any value within the range $R_1$ designated by hatching in FIG. 8. Accordingly, by the configuration of the embodiment of FIG. 6, it is possible to select the load impedance seen from the source 13 from a wide range. Therefore, by appropriately selecting the capacitances of the capacitors 14 and 15 the reflection coefficient of the FET 1 seen from the gate 11 can be maintained large, thereby providing a microwave oscillator which is highly resistive against impedance variations of the load.

As has been described, by appropriately selecting the values of the inductive element 2 and the capacitors 14 and 15, a more stable microwave oscillator than those embodiments of FIG. 2 and FIG. 4 is obtainable.

Figure 9:
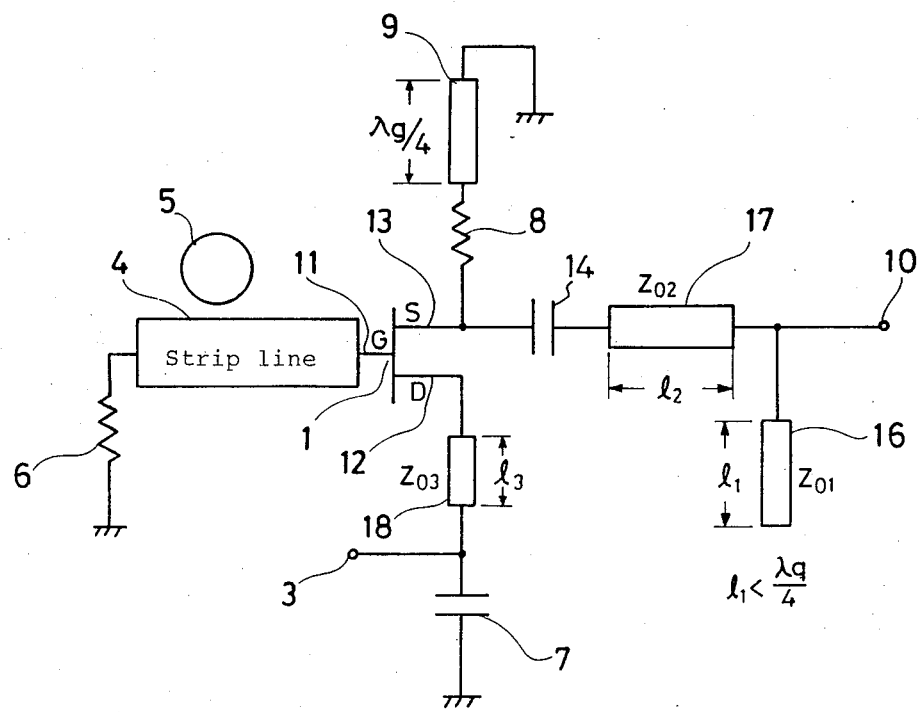
FIG. 9 is a circuit diagram of a microwave oscillator of a fourth embodiment.

FIG. 9 is a circuit diagram of a fourth embodiment of a microwave oscillator in accordance with the present invention, wherein a chip FET 1 is connected by its gate 11 to one end of a strip line 4, the other end thereof being terminated by a dummy resistor 6, by its source 13 through a capacitor 14 and a inductive strip line 17 of a length $l_2$ to an output terminal 10, and also through a self bias resistor 8 and ¼ wavelength transmission line 9 to ground, and by its drain 12 through an inductive strip line 18 of length of $l_3$ to a power source terminal 3, which is grounded through a bypass capacitor 7. Furthermore, an open ended capacitive strip line 16 of $l_1$ length and having a characteristic impedance of $Z_{01}$ is connected to the output line 10. The operation of the microwave oscillator configured as FIG. 9 is elucidated. Non-grounded end of the ¼ wavelength transmission line 9 forms an open end at microwave frequency, hence this functions as a kind of low pass filter which passes only bias current, and the oscillation output is transmitted only to the output terminal 10. The dielectric resonator 5 which has a high Q value and the strip line 4 constitute a known resonance circuit, which oscillates at a resonance frequency of the dielectric resonator 5. The inductive strip line 18 is designed to work as an inductive component for oscillation frequency by known principle and hence by selectively setting the length $l_3$ and its characteristic impedance $Z_0$, it functions to increase the negative resistance at the gate 11 at the oscillation frequency. The capacitor 14 functions to increase the negative resistance at the gate 11 at the oscillation frequency. The open ended capacitive strip line 16 is designed such that its length is shorter λg/4 so that it serves as a capacitive component at the oscillation frequency. Accordingly, by appropriately selecting the characteristic impedances $Z_{01}$ and $Z_{02}$ as well as lenghths $l_1$, $l_2$ of the strip lines 16 and 17, respectively, it is possible to select the load impedance seem from source 13 in a wider range than the embodiment of FIG. 6.

Figure 10:
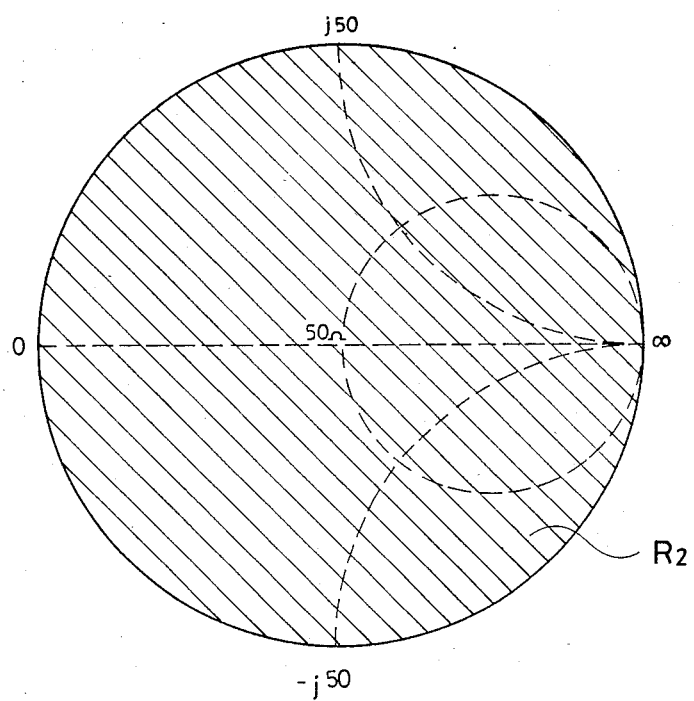
FIG. 10 is a diagram showing a characteristic of the fourth embodiment.

FIG. 10 is a Smith chart showing impedance seen from the source 13 of the chip FET 1 to the load of the microwave oscillator of FIG. 9. The impedance of the load from the source 13 to the load can be selected at any point within the range $R_2$ shown by hatching in FIG. 10, by varying the capacitance value of the capacitor 14, the characteristic impedance $Z_{01}$ and length $l_1$ of the capacitive open ended strip line 16 and characteristic impedance $Z_2$ and length $l_2$ of the strip line 17. The realizable range $R_2$ is made wider than the realizable range of the impedance seen from the source to the load of FIG. 6. Accordingly, in the embodiment of FIG. 9, it is possible to select the load impedance in a wider range than the embodiment of FIG. 6. Furthermore, by appropriately selecting the constants of the circuit components, the reflection coefficient $|\bar{G}|$ seen from the gate 11 of the FET 1 to the load can be retained large, and a microwave oscillator which is very stable at impedance variation of the load is obtainable.

Figure 11:
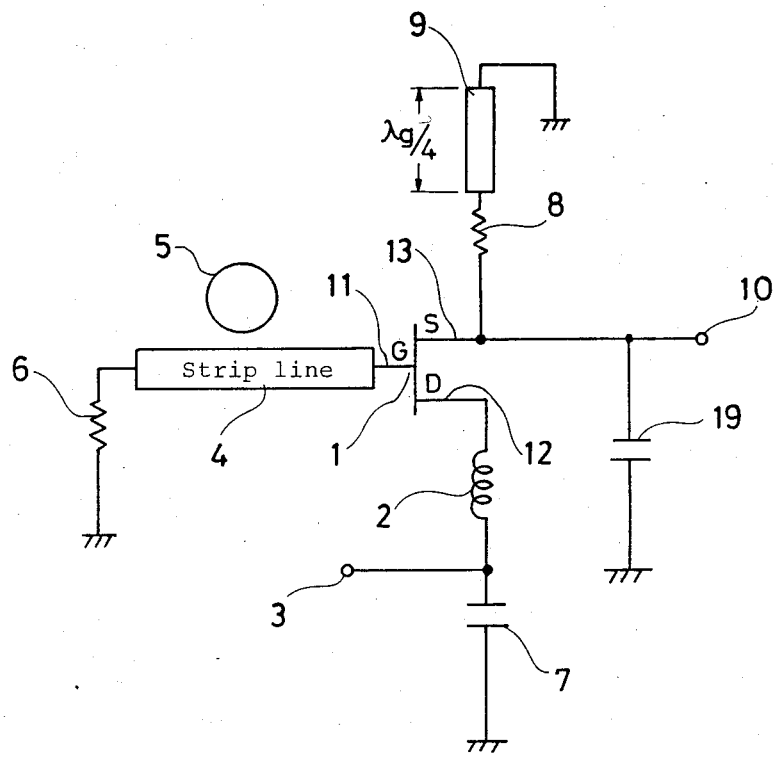
FIG. 11 is a circuit diagram of a microwave oscillator of a fifth embodiment.

FIG. 11 is a circuit diagram of a fifth embodiment of the present invention. In this embodiment, chip FET 1 is connected by its gate 11 to one end of a strip line 4 of characteristic impedance of 50Ω, the other end thereof being terminated by the dummy resistor 6, by its source 13 to an output terminal 10, and also through a self-bias resistor 8 and a ¼ wavelength transmission line 9 to the ground, and by its drain 12 through an inductive element 2 to a power source terminal 3, which is grounded through a capacitor 7.

The operation of the microwave oscillator shown in FIG. 11 is elucidated. Non-grounded end of the ¼ wavelength transmission line 9 forms an open end at microwave frequency, hence this functions as a kind of low pass filter which passes only DC bias current, and the oscillation output is transmitted to the output terminal 10 only. The dielectric resonator 5 which has a high Q value and the strip line 4 constitute a known resonance circuit, which oscillates at a resonance frequency of the dielectric resonator 5. The inductive element 2 has a function to increase negative resistance which occurs at the oscillation frequency at the gate 11 when the drain 12 of the chip FET 1 is grounded. The capacitor 19 functions to further increase the reflection coefficient $|\bar{G}|$ at the oscillation frequency of FET 1 seen from its gate 11.

Figure 12:
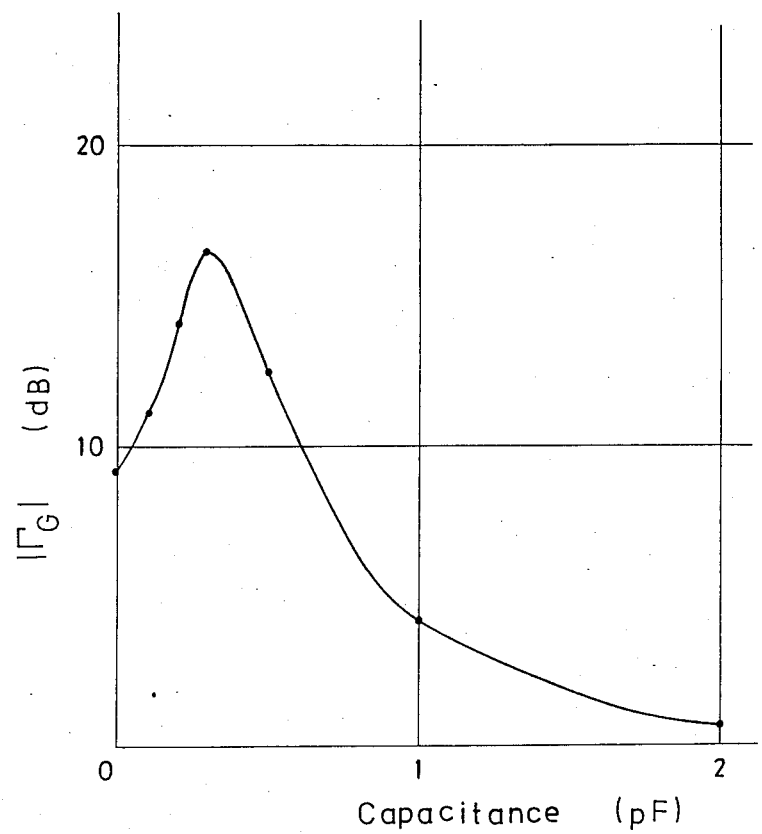
FIG. 12 is a graph showing a characteristic of the fifth embodiment.

The graph of FIG. 12 shows a relation between the reflection coefficient $|G|$ at the oscillation frequency of FET 1 seen from its gate 11 which shows negative resistance at the oscillation frequency induced at the gate 11 vs. the value of capacitance of the capacitor 19 with respect to a use of a chip FET 1, wherein the inductance of the inductive element 2 is 1.5 nH, and the oscillation frequency is 10.75 GHz. A shown in FIG. 12, when the capacitance of the capacitor 19 is 0.3 PF, a higher negative resistance at the gate 11 is obtainable than a case without such capacitor 19; by using the capacitor 19, the oscillation easily starts even when there is a low reflection coefficient of resonance circuit which consists of the strip line 4 and the dielectric resonator 5.

Figure 13:
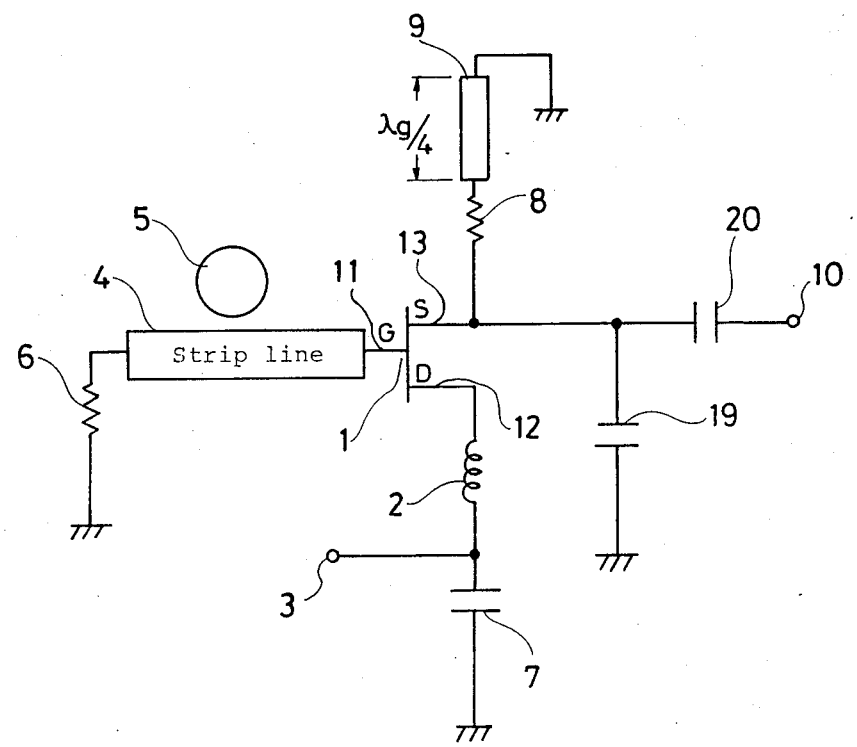
FIG. 13 is a circuit diagram of a microwave oscillator of a sixth embodiment.
Figure 14:
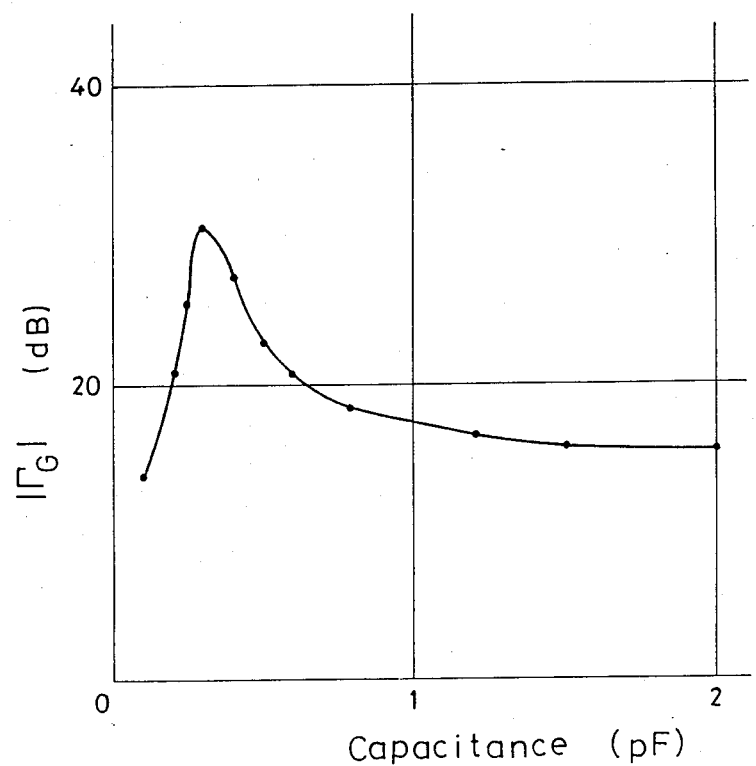
FIG. 14 is a graph showing a characteristic of the sixth embodiment.

FIG. 13 is a circuit diagram of a microwave oscillator of still another embodiment of the present invention. In this embodiment, a capacitor 20 is inserted between the source 13 and the output terminal 10, in the circuit of FIG. 11; and other parts and components are configurated the same as the embodiment of FIG. 11. The operation of the microwave oscillator shown in FIG. 13 is elucidated. Like the embodiment of FIG. 11, the non-grounded end of the ¼ wavelength transmission line 9 forms an open end in microwave frequency, and this functions as a kind of low pass filter which passes only DC bias current and oscillation output is transmitted to the output terminal 10 only. The dielectric resonator 5 which has a high Q value and the strip line 4 constitute a known resonance circuit, which oscillates at a resonance frequency of the dielectric resonator 5. The capacitor 20 functions to increase negative resistance at the gate 11 of the FET 1 at the oscillation frequency more extensively than the case of the circuit of FIG. 11. The graph of FIG. 14 shows a relation between the reflection coefficient $|\bar{G}|$ at the oscillation frequency of FET 1 seen from its gate 11 which shows a negative resistance at the oscillation frequency (for instance, 10.75 GHz) induced at the gate 11 vs. the value of the capacitance of the capacitor 20 for a chip FET 1, obtained by computation. As shown in FIG. 14, when the capacitance of the capacitor 20 is 0.3, a higher negative resistance of the gate 11 of the FET 1 is obtainable than in the case without the insertion of the capacitor 20, and the oscillation condition of the resonance circuit consisting of the strip line 4 and the dielectric resonator 5 is eased, and a more stable microwave oscillator is constituted. Furthermore, since the output terminal 10 and the source 13 are isolated by the capacitor 20 with respect to direct current, there is no need of inserting a DC blocking capacitor at the output terminal, and hence the number of total electronic components can be decreased.

In the above-mentioned embodiments, the FET used is a chip FET, but of course a package FET 1 may be used, and the same function and performance are obtainable; furthermore all of the circuit or a part of the circuit may be constituted as MMIC.

Though a dielectric resonator 5 is used in the abovementioned embodiments, other types of resonator or resonance circuit may be used. Instead of the use of electronic components such as, inductive elements or capacitors, of lumped parametric constant in the embodiments of FIGS. 2, 4, 6, 11 or 13, the electronic components may be distributed constant circuits of the equivalent characteristics. Furthermore, in the embodiment of FIG. 9, either one or both of the strip lines 17 and 18 may be realized by an inductive element (of lumped parametric constant). Besides, in the circuit of FIG. 9, instead of the capacitive open ended strip line 16, a capacitive closed ended strip line may be used, or alternatively a capacitor of lumped parametric constant component such as an MIM capacitor may be used. Optimum values of the inductive element 2, strip lines 16, 17 and 18, capacitors 14, 15, 19 and 20 may be different from the values disclosed in the embodiment, depending on the characteristic of the FET 1.

In the microwave oscillator of the above-mentioned configuration, in order to impress a lower voltage on the gate 11 of the FET 1 than the source 13, the dummy resistor 6 of, for instance, about 50 Ω is actually grounded with respect to DC current. That is, in order to make the voltage of the gate 11 equal to ground potential, it is necessary to ground one end of the dummy resistor 6 by making a through-hole on a microwave substrate. That is, grounding of the resonance circuit by some means has been required. Furthermore, in such configuration, there is a problem that if the gate 11 of the FET 1 is grounded with a low resistance with respect to DC current, there is a possibility of large current flows from the gate 11 to the source 13 of the FET 1, that is, in the forward direction of the gate current, in positive half cycles of oscillation, since the oscillation is a large amplitude operation of the FET 1, thereby to shorten the lifetime of the FET 1.

Figure 15:
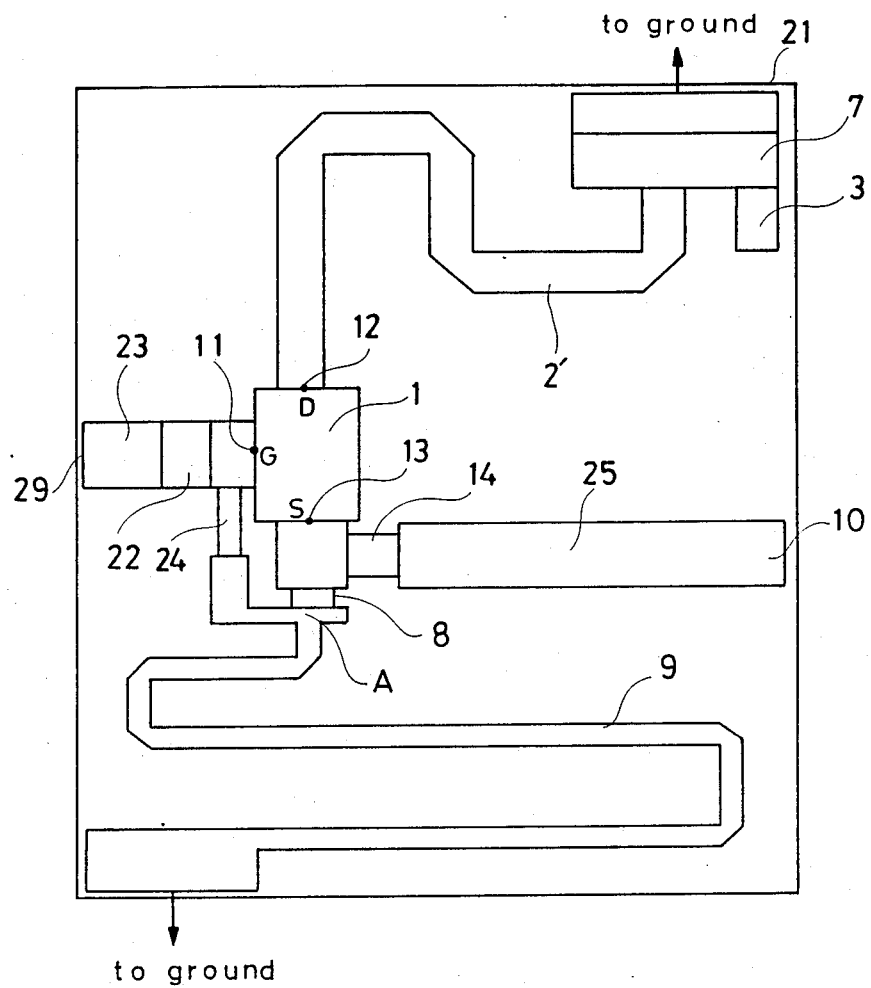
FIG. 15 is a MMIC (Monolithic Microwave Integrated Circuit) chip pattern diagram of a microwave oscillator of a seventh embodiment.
Figure 16:
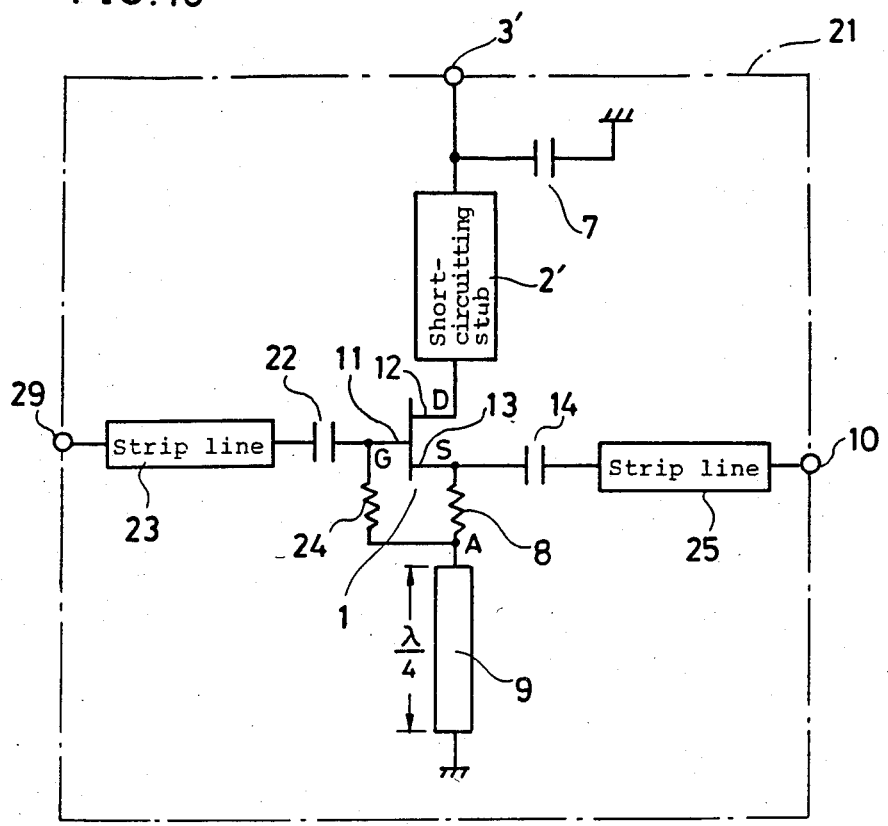
FIG. 16 is an equivalent circuit diagram of the seventh embodiment.
Figure 17:
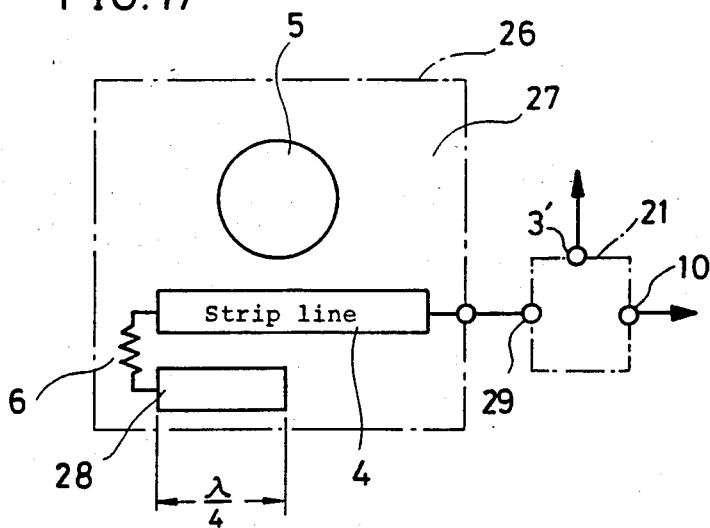
FIG. 17 is a partial circuit diagram of a microwave oscillator utilizing the MMIC of the embodiment of FIG. 15.

FIG. 15, FIG. 16 and FIG. 17 show a further improved embodiment wherein the above-mentioned problem of undesirable flow of large current from the gate 11 to the source at the oscillation is dissolved. FIG. 15 shows a pattern of an MMIC (Monolithic Microwave Integrated Circuit) chip, FIG. 16 is an equivalent circuit diagram of the MMIC chip of FIG. 15 and FIG. 17 is a drawing of a microwave oscillator using the MMIC chip. The corresponding parts and components with the preceding embodiments are designated by the same reference numerals. In FIG. 15, FIG. 16 and FIG. 17, the MMIC chip 21 is connected in a drain-grounded circuit. The source 13 of the FET 1 is grounded through a series connection of a self-bias resistor 8 and a ¼ wavelength strip line 9. To the gate 11 of the FET 1, a series connection of a DC blocking capacitor 22 and a strip line 23 having characteristic impedance of 50Ω is connected. A high resistance resistor 24 is connected between the gate 11 of the FET 1 and a junction point A between the self-bias resistor 8 and the ¼ wavelength strip line 9. The drain 12 of the FET 1 is connected through a shortcircuiting stub 2' and a bypass capacitor 7 to the ground, and the junction point between the shortcircuiting stub 2' and the capacitor 7 is connected to a positive voltage feeding point 3', wherefrom a bias voltage is fed. The source 13 is connected through a series connection of a capacitor 14 and a strip line 25 of characteristic impedance of 50Ω to the output terminal 10. A resonance circuit 26 comprises a dielectric resonator 5, a strip line 4, a dummy resistor 6 of 50Ω and an open ended ¼ wavelength strip line 28. The dielectric resonator 5 is electromagnetically coupled with the strip line 4 and the ¼ wavelength strip line 28. The 50Ω dummy resistor 6 is not grounded with respect to DC current. By connecting the terminal 29 of the MMIC chip 21 to the resonance circuit 26, as seen from the terminal 29, the MMIC chip 21 having a negative resistance reacts with the dielectric resonator 5, so that the oscillation frequency of the microwave oscillator is controlled by the resonance frequency of the dielectric resonator 5. Oscillation output is supplied to a load connected to the output terminal 10 of the MMIC chip.

In the embodiments shown in FIGS. 15, 16 and 17, grounding with respect to DC current of the gate 11 of the FET 1 is made through a high resistance resistor 24 formed inside the MMIC chip 21. Therefore, there is no need of providing a grounding circuit on the side of the resonance circuit unit 26, and the configuration of the resonance circuit 26 is simplified. Furthermore, possibility of occurrence of dangerous large current in the FET 1 at oscillation can be prevented by selection of the value of the high resistance resistor 24 connected across the source 13 and the gate 11 to be from several KΩ to several tens KΩ, and thereby, deterioration of lifetime of MMIC is prevented.

Figure 18:
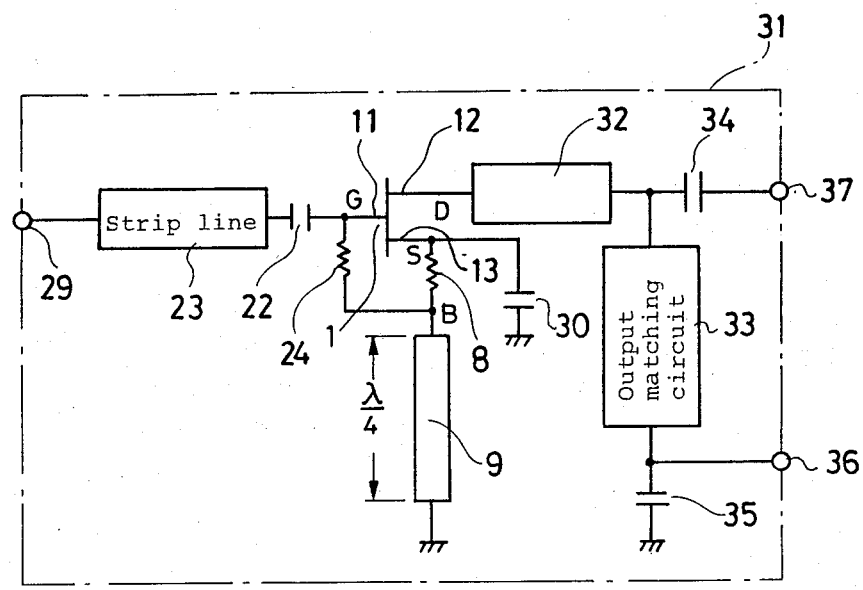
FIG. 18, FIG. 19 and FIG. 20 are equivalent circuit diagrams of MMICs of the microwave oscillator of still another embodiment of the present invention.

FIG. 18 is circuit diagram of a still another embodiment of an MMIC oscillator embodying the present invention, wherein the difference from the configuration of FIG. 16 is that the circuit of FIG. 18 has a bypass capacitor 30 connected between the source 13 and the ground, to make the circuit a source-grounded oscillator, whereas the circuit of FIG. 16 is of a drain grounded oscillator. Other parts and components are the same as the circuit of FIGS. 16 and 17. The source 13 of the MMIC chip 31 is grounded through a series connection of a ¼ wavelength strip line 9 and a self-bias resistor 8, and the source 13 is further grounded by a bypass capacitor 30. The gate 11 of the FET is connected through a series connection of a DC blocking capacitor 22 and a strip line 23 of a characteristic impedance of 50Ω to a resonance circuit connection terminal 29. A junction point B between the self-bias resistor 8 and the ¼ wavelength strip line 9 is connected through a high resistance resistor 24 formed on the MMIC to the gate 11. The drain 12 of the FET 1 is connected through an output matching circuit configurated by series-connected strip lines 32 and 33; and the junction point between the strip lines 32 and 33 is connected through a DC blocking capacitor 34 to an output terminal 37, and the other end of the output matching circuit 33 is connected to a drain-bias-feeding terminal 36 and also is grounded through a bypass capacitor 35. The circuit issues an oscillation output from the output terminal 37 when a resonance circuit 26 shown in FIG. 17 is connectd to the terminal 29.

Since the grounding of the gate 11 of the FET with respect to DC voltage is made through the high resistance resistor 24 formed in the MMIC chip 31, there is no need of providing a grounding terminal for the gate 11 of the FET 1 on the side of the resonance circuit 26. Therefore, the configuration of the resonance circuit is simplified. Furthermore, by selecting the resistance of the resistor 24 high, for instance from several KΩ to several tens KΩ, the dangerously large forward gate current at the oscillation can be suppressed.

Figure 19:
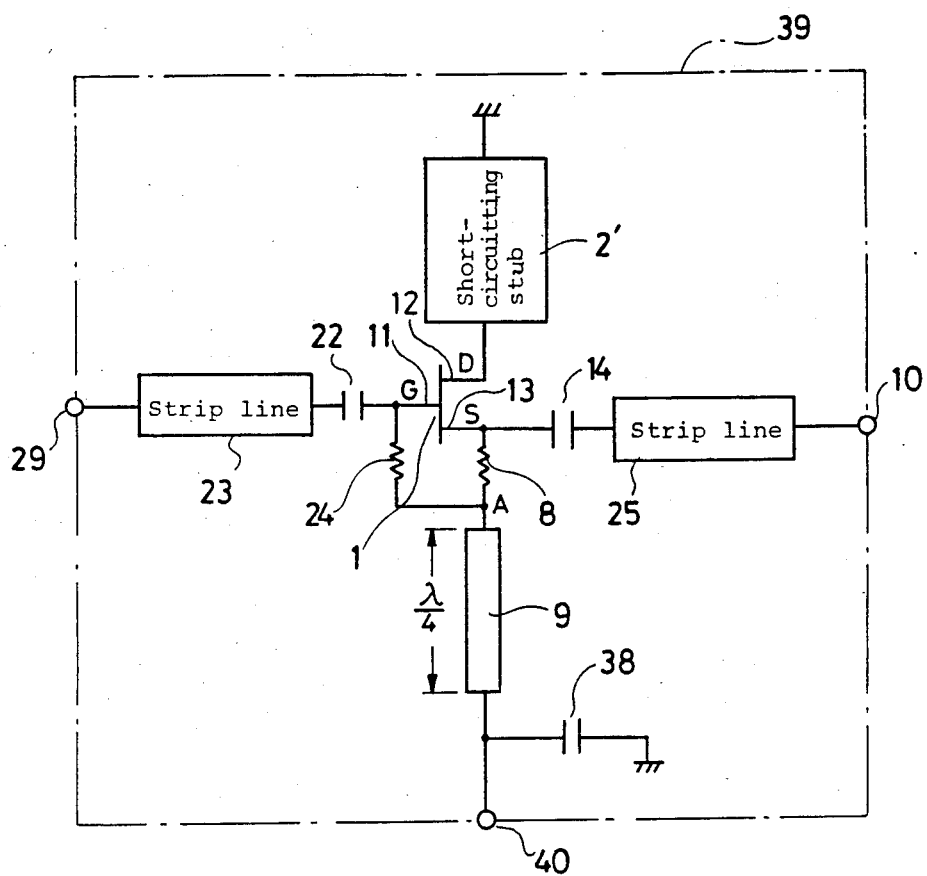

FIG. 19 is an equivalent circuit diagram of another embodiment of the MMIC in accordance with the present invention. Principal difference from the foregoing embodiment of FIG. 16 is that, this embodiment of FIG. 19 utilizes a negative bias voltage, whereas the embodiment of FIG. 16 uses the positive bias power source. Therefore, in the circuit of FIG. 19, one end of the shortcircuiting stub 2' is grounded. And the ¼ wavelength strip line 9 is bypassed by a bypass capacitor 38 with respect to the oscillation frequency. As the bias power source of the MMIC chip 39, a negative voltage is impressed from the source bias terminal 40, and other parts are the same as those of FIG. 16.

In the embodiment of FIG. 19, wherein the negative bias power source is used, the gate 11 becomes the same potential as that of the source bias terminal 40, whereas if the gate 11 is grounded through the resonance circuit the gate 11 becomes ground potential and a normal bias voltage fails to be impressed on the gate 11. In this embodiment of FIG. 19, however, normal bias voltages are impressed on respective electrodes of the FET 1, and therefore, the negative bias voltage can be used. Furthermore, the effects obtained in the embodiment of FIG. 16 are also realized in this embodiment.

Figure 20:
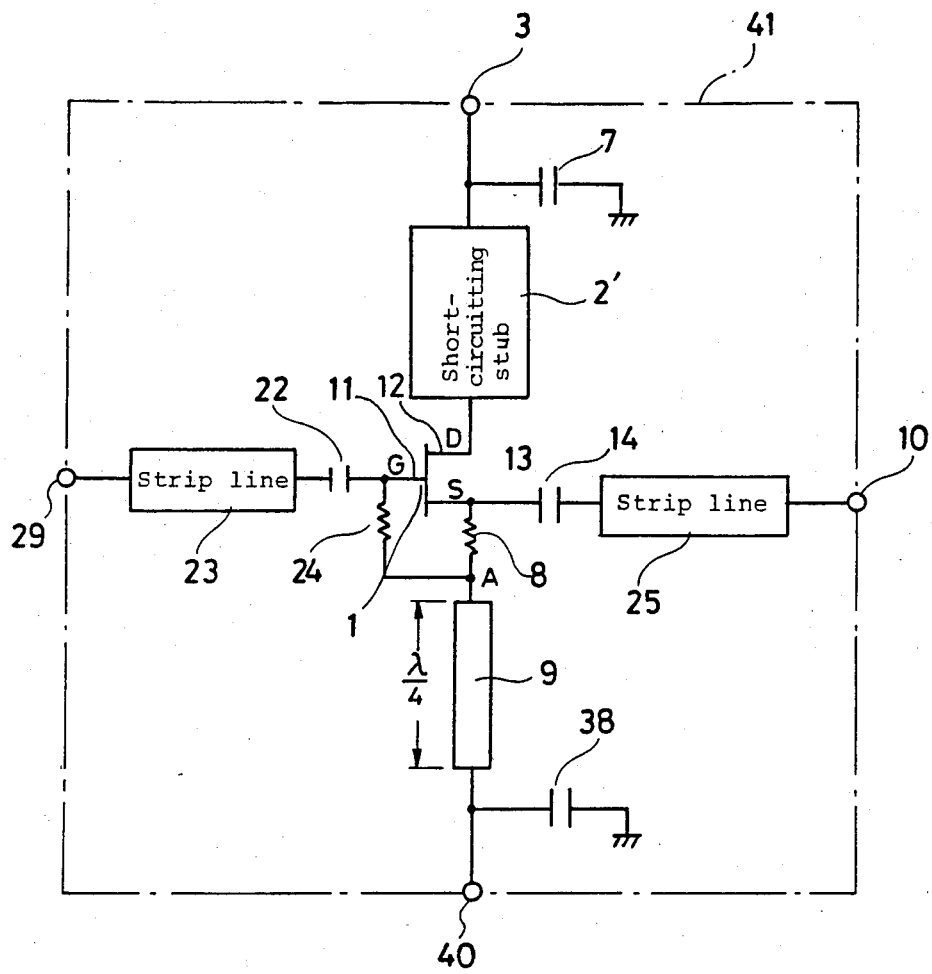

FIG. 20 is an equivalent circuit diagram of a still another embodiment of an MMIC oscillator embodying the present invention, wherein the difference from the configuration of FIG. 16 and FIG. 19 is that the circuit of FIG. 20 has both the bypass capacitor 7 to bypass the end of the shortcircuiting stub 2' and a bypass capacitor 38 to bypass the end of the ¼ wavelength strip line 9, both at the oscillation frequency. Other parts and components are the same as the circuits of FIG. 16 and FIG. 19. The drain bias terminal 3 and the source bias terminal 40 are impressed with bias voltages, and are grounded with respect to microwave frequency. If the voltage to be impressed on the drain bias terminal 3 is selected to be higher than the voltage to be impressed on the source bias terminal 40, selection of polarities of the bias voltages becomes optional.

In the embodiment of FIG. 20, besides the effect of optional selection of the polarities of the bias voltages, other effects of the embodiments of FIG. 16 and FIG. 19 are realized.

In the aforementioned embodiments, the capacities and the inductors may be replaced with capacitive elements such as capacitive strip lines and the inductive elements such as inductive strip lines, respectively, and the same operation and function are obtainable thereby.

What is claimed is:

1. A dielectric resonator microwave oscillator having enhanced negative resistance comprising:
    an FET, having a gate, a drain and a source;
    a microwave resonator connected to said gate of said FET;
    an inductive element, one end of which is connected to said drain of said FET, and the other end of which is grounded with respect to microwave frequency;
    an output terminal;
    a series connection of a second inductive element and a first capacitive element connected between said source of said FET and said output terminal; and
    a second capacitive element, having one end connected to said output terminal and another end which is grounded with respect to microwave frequency.

2. A dielectric resonator microwave oscillator having enhanced negative resistance comprising:
    an FET having a gate, source and drain;
    a microwave resonator connected to said gate of said FET;
    an inductive element connected by one end to said drain of said FET, and grounded at the other end thereof with respect to microwave frequency;
    an output terminal connected to said source of said FET;
    a series connection of a low resistance resistor and a ¼ wavelength strip line connected with said resistor connected to the source; and
    a high resistance resistor, connected between said gate and the junction point between said low resistance resistor and said ¼ wavelength strip line.

3. A dielectric resonator microwave oscillator having enhanced negative resistance in accordance with claim 2, wherein said microwave resonator comprises:
    a strip line connected to said gate of said FET;
    a dielectric resonator electromagnetically coupled to said strip line; and
    a dummy resistor which is connected to said strip line and is isolated from ground with respect to DC current, but is grounded with respect to microwave frequency current.

4. A dielectric resonator microwave oscillator having enhanced negative resistance in accordance with claim 2, wherein:
    one end of said ¼ wavelength strip line is bypassed by a bypass capacitive element and the other end of said ¼ wavelength strip line is connected to the source through said low resistance resistor, and said other end of said inductive element is grounded by a second bypass capacitive element.

5. A dielectric resonator microwave oscillator having enhanced negative resistance in accordance with claim 2, wherein:
    a DC blocking element is provided between the gate and said microwave resonator.

6. A dielectric resonator microwave oscillator having enhanced negative resistance comprising:
    a FET having a drain, source and gate;
    a microwave resonator connected to said gate of said FET;
    a low resistance resistor connected by one end thereof to said source of said FET;
    a ¼ wavelength strip line connected by one end thereof to the other end of said low resistance resistor, the other end of said ¼ wavelength strip line being grounded with respect to microwave frequency; and
    a high resistance resistor connected between said gate and a junction point between said low resistance resistor and said strip line.

7. A dielectric resonator microwave oscillator having enhanced negative resistance in accordance with claim 6, which further comprises:
    a capacitive element connected between the source of said FET and ground; and
    an output terminal connected to said drain of said FET.

8. A dielectric resonator microwave oscillator having enhanced negative resistance comprising:
    a FET having a gate, source and drain;
    a reflex microwave resonator connected to said gate of said FET;
    a first inductive element connected to said gate of said FET;
    a second inductive element connected by one end to said drain of said FET, and grounded by the other end thereof with respect to microwave frequency, said second inductive element having an inductance with an absolute value of a reflection coefficient seen from the gate of said FET which is larger than 1 at a resonant frequency of said microwave resonator; and
    an output terminal connected to said source of said FET.

9. A dielectric resonator microwave oscillator having enhanced negative resistance in accordance with claim 8, further comprising a first capacitive element connected between said output terminal and said source, said first capacitive element having a capacitance with an absolute value of a reflection coefficient seen from the gate of said FET that is larger than 1 at a resonant frequency of said microwave resonator.

10. A dielectric resonator microwave oscillator having enhanced negative resistance in accordance with claim 9, wherein:
    a second capacitive element is connected between said output terminal and ground, and said second capacitive element has a capacitance where an absolute value of a reflection coefficient seen from the gate of said FET is larger than 1 at a resonant frequency of said microwave resonator.

11. A dielectric resonator microwave oscillator having enhanced negative resistance in accordance with claim 8, further comprising a first capacitive element, connected between said source and ground, said first capacitive element having a capacitance where an absolute value of a reflection coefficient seen from the gate of said FET is larger than 1 at said resonance frequency of said microwave resonator.

12. A dielectric resonator microwave oscillator having enhanced negative resistance in accordance with claim 11, further comprising a second capacitive element, connected between said source and said output terminal, wherein said second capacitive element has a capacitance where an absolute value of a reflection coefficient seen from the gate of said FET is larger than 1 at a resonant frequency of said microwave resonator.

* * * * *